United States Patent [19]

Noguchi et al.

[11] Patent Number: 5,105,384

[45] Date of Patent: Apr. 14, 1992

[54] LOW CURRENT SEMICONDUCTOR MEMORY DEVICE

[75] Inventors: Kenji Noguchi; Yasushi Terada; Takeshi Nakayama; Kazuo Kobayashi, all of Hyogo, Japan

[73] Assignee: Mitsubishi Denki Dabushiki Kaisha, Tokyo, Japan

[21] Appl. No.: 178,166

[22] Filed: Apr. 6, 1988

[30] Foreign Application Priority Data

Apr. 8, 1987 [JP] Japan ................... 62-87402

[51] Int. Cl.⁵ ............. G11C 7/00; G11C 16/00; G11C 11/408
[52] U.S. Cl. ............. 365/185; 365/189.05; 365/230.08; 365/238.5
[58] Field of Search ............. 365/94, 104, 185, 189, 365/235, 189.05, 230.08, 238.5; 357/42

[56] References Cited

U.S. PATENT DOCUMENTS

| | | | |
|---|---|---|---|
| 4,654,826 | 3/1987 | Yamanouchi et al. | 365/189.05 |
| 4,694,427 | 9/1987 | Miyamoto et al. | 365/185 |
| 4,710,900 | 12/1987 | Higuchi | 365/185 X |
| 4,733,371 | 3/1988 | Terada et al. | 365/185 |
| 4,761,764 | 8/1988 | Watanabe | 365/189 X |
| 4,785,424 | 11/1988 | Lin et al. | 365/185 |

OTHER PUBLICATIONS

P.Suciu et al "A 64K EEPROM with Extended Temperature and Page Mode Operation", Digest of Technical Papers, 1985 IEEE International Solid-State Circuits Conference (Feb. 14, 1985): 170-172 and 336.

Primary Examiner—Alyssa H. Bowler
Attorney, Agent, or Firm—Lowe, Price, LeBlanc & Becker

[57] ABSTRACT

Each column latch circuit latches a potential of each bit line and that of each control gate line before information is written in a memory cell. Thus, so-called page mode writing can be performed. A column latch circuit comprises two inverters of the same polarity and statically latches an input potential. As a result, chip size can be reduced without any leakage of an electric charge representing information. Reduction of operating current requirements is also achieved by the use of inverters of the same polarity in combination with control of at least one transistor within each of the two inverters.

15 Claims, 5 Drawing Sheets

LOW CURRENT SEMICONDUCTOR MEMORY DEVICE

BACKGROUND OF THE INVENTION

1. Field of the Invention

The present invention relates to a semiconductor memory device and, more particularly, to an improved column latch circuit of an electrically erasable programmable nonvolatile semiconductor memory device (hereinafter referred to as an EEPROM).

2. Description of the Prior Art

FIG. 1 is a circuit diagram partly showing a conventional memory cell array of 64 K bit EEPROM and a column latch. Referring to FIG. 1, each of $M_{0,0}$, $M_{15,0}$ and $M_{0,1}$ is a 1-byte memory cell block and memory cell blocks up to $M_{15,511}$ of a total of 8192 bytes (not shown) are provided. Since 1 byte consist of 8 bits, the total bits are 64 K bits. Each memory cell of 1 bit comprises a select gate transistor 1 and a memory transistor 2, and the gate transistor 1 has its drain connected to a bit line 3, its gate connected to a word line 4 and its source connected to the drain of the memory transistor 2. The source of each memory transistor 2 is grounded. The total of 512 word lines 4 are provided corresponding to the number of columns of the array of memory cell blocks $M_{0,0}$ etc. and any one of them is selected by an output of an X decoder 5.

Each bit line 3 is connected to the source of a Y gate transistor 6. Each Y gate transistor 6 has its gate connected to a Y gate line 7 and its drain connected to an I/O line 8. The I/P lines 8 comprise eight lines of $I/O_0$ to $I/O_7$ so that data of 1 byte can be inputted and outputted simultaneously to and from each of the memory cell blocks $M_{0,0}$ etc. 16 Y gate lines 7 are provided in total corresponding to the number of rows of the array of memory cell blocks $M_{0,0}$ etc. and any one of them is selected by an output of the corresponding Y decoder 9. Each of the Y gate lines 7 is connected to a gate of a Y gate transistor 10 other than the above-mentioned eight Y gate transistors 6. Each Y gate transistor 10 has its source connected to a control gate line 11 and its drain connected to a CG line 12.

Each word line 4 is connected to a select gate transistor 13 other than the above-mentioned select gate transistors 1 of the respective memory cells and provided for each memory cell block, that is, for one byte. Each select gate transistor 13 has its drain connected to the corresponding control gate line 11 and its source connected to the respective control gates of the eight memory transistors 2 in the corresponding memory cell block.

A high voltage switch 16 comprising transistors 14 and 15 and a capacitance $C_1$, a bit line latch 18 comprising a transistor 17 and a capacitance $C_2$, and a transistor 19 which is turned on and off in response to latched contents of the bit line latch 18 are provided at an end of each bit line 3. A high voltage Vpp is applied from a high voltage source such as a charge pump (not shown) to the drain of the transistor 14. The transistor 14 has its gate connected to a node N1 between the bit line 3 and the source of the transistor 15 and its source connected to a node N2 between one electrode of the capacitance $C_1$ and the gate and drain of the transistor 15. A charge-up clock signal $\phi_1$ is applied to the other electrode of the capacitance $C_1$ through the transistor 19. The transistor 19 has its gate connected to one electrode of the capacitance $C_2$ and the drain of the transistor 17 and the above-mentioned electrode of the capacitance $C_2$ is also connected to the bit line 3 at the node N1. The other electrode of the capacitance $C_2$ and the source of the transistor 17 are grounded. A reset signal RST1 is applied to the gate of the transistor 17.

A high voltage switch 22 comprising transistors 20 and 21 and a capacitance $C_3$, a control gate line latch 24 comprising a transistor 23 and a capacitance $C_4$, and a transistor 25 which is turned on and off in response to latched contents of the control gate line latch 24 are provided at an end of each control gate line 11. A structure thereof is the same as in the case of the high voltage switch 16 and the bit line 18. In this specification, the bit line latch 18 and the control gate line latch 24 are generally referred to as column latches.

The gate of the memory transistor 2 shown in FIG. 1 has a two-layer structure and a lower gate thereof is covered with an insulator and referred to as a floating gate. When storing, a positive or negative charge is stored in this floating gate, a threshold value of the memory transistor 2 is changed and binary information of "0" or "1" is stored. A part of an oxide film in which the floating gate overlaps with the drain is formed to be so thin that electrons tunnel through this thin oxide film and are exchanged between the floating gate and the drain. More specifically, erasing is effected, that is, the threshold value of the memory transistor 2 is shifted to a high level when a high voltage to the control gate is applied to introduce electrons to the floating gate, so that information "1" is stored. Meanwhile, programming is effected, that is, the threshold value of the memory transistor 2 is shifted to a low level when a high voltage is applied to the drain to withdraw electrons from the floating gate, so that information "0" is stored. At the time of erasing, a high voltage is applied to the word line 4 and the control gate line 11, and the bit line 3 is caused to be at a ground potential. At the time of programming, a high voltage is applied to the word line 4 and the bit line 3, and the control gate line 11 is caused to be at the ground potential.

As shown in FIG. 1, the control gates of the memory transistors 2 of the eight memory cells for one byte are connected commonly. When the programming is to be carried out, erasing operation is performed simultaneously for those eight memory cells and "1" is written in all of them, and then programming operation is performed simultaneously for the memory cells of the bits where information "0" is to be written out of the eight memory cells. Since a duration of a high-voltage pulse applied during the erasing and the programming is normally in a range from 1 millisecond to several milliseconds, it takes approximately 10 milliseconds to write data in the memory cells for one byte. Therefore, if writing operation is performed for each byte, it will take a long time to write data in the whole region of the chip.

Therefore, an EEPROM of a large-scale integration of more than 64K bits is provided with a page mode function in which writing operation is performed simultaneously for a plurality of bytes (16 bytes in the example of FIG. 1) on the same word line 4. FIG. 2 is a flow chart showing a procedure of page mode writing. In the page mode writing, a writing cycle is divided into an external writing cycle S1 and an internal writing cycle S2. The external writing cycle S1 is a cycle during which data is written from outside into the device. For example, addressing operation is performed in the same manner as in writing in a static RAM and data is inputted. However, in this cycle, the inputted data is not written into a memory cell, but it is taken in the column latches 18 and 24 provided on the bit line 3 and the control gate line 11, respectively as will be described in the following.

When a power supply is turned on and a writing cycle is started, reset signals RST1 and RST2 are applied to the column latches 18 and 24, respectively. This causes the transistors 17 and 23 to be turned on and electric charge stored in the capacitances $C_2$ and $C_4$ to be discharged (and the column latches 18 and 24 are reset. Then, when the external writing cycle S1 is started, a signal of a supply voltage level (5V) is applied to the CG line 12 and an inverted signal of input data is applied to the I/O lines 8. Only one Y gate line 7 corresponding to a byte to be written rises to the supply voltage level (referred to hereinafter as the "H" level) by the Y decoder 9 addressed and the Y gate transistors 6 and 10 of that byte are turned on. As a result, the control gate line 11 of that byte is connected to the CG line 12 and attains the "H" level. Eight bit lines 3 of that byte are also connected to the corresponding I/O lines 8 and attains H" level if input data is "0" or a low level (referred to hereinafter as the "L"- level) if it is "1". Consequently, the respective potentials of the bit lines 3 and the control gate line 11 for a byte to be written are stored and latched in the capacitances $C_2$ and $C_4$ of the column latches 18 and 24, respectively.

Next, another addressing operation is performed and by input of data, information is latched in the column latches 18 and 24 corresponding to another byte to be written on the same word line. These operations are performed repeatedly, so that information to be written for one page is stored in the column latches 18 and 24. More specifically, the column latches 18 and 24 serve to keep a potential of the control gate line 11 for a byte where data is to be updated at approximately the supply voltage level and to keep a potential of the bit line 3 for a bit where data "0" is to be written at approximately the supply voltage level. Duration of the external writing cycle S1 is controlled by a timer T.

When the external writing cycle S1 is completed, the internal writing cycle S2 is automatically started. In this cycle, the high voltage Vpp is generated using a charge pump and the like in the semiconductor memory device and potentials of the bit lines 3 and the control gate line 11 are raised by the high voltage switches 16 and 22 in accordance with data latched by the column latches 18 and 24, whereby erasing and programming operations of the memory cells for one page are performed concurrently. While details will be described later, first, during an erasing cycle, all the memory cells for a byte to be rewritten out of one page are erased together, and then during a programming cycle, memory cells of bits where "0" is to be written of that byte to be rewritten are programmed together.

During the erasing cycle, a high voltage of Vpp rises to 20V and the charge-up clock signal $\phi_2$ starts to oscillate between 0V and 5V. At this time, the bit lines 3 are kept at "L" level, for example by turn-on of a transistor (not shown) provided between the bit lines 3 and the ground. During the external writing cycle, in the case of the "H" level 5V) being latched in the capacitance $C_2$ of the column latch 18 of the bit line 3, a potential of the bit line 3 is in an "L" level floating state of approximately 0.2 to 0.3V if the ratio of the bit line capacitance to the latch capacitance $C_2$ is approximately 10:1. For a byte to be rewritten, that is, a byte in which the "H" level is latched in the capacitance $C_4$ of the column latch 24 of the control gate line 11 during the external writing cycle, the corresponding transistor 25 is on and, therefore, the charge-up clock signal $\phi_2$ is applied only to the capacitance $C_3$ of the high voltage switch 22 corresponding to the byte to be rewritten and a potential of the control gate line 11 of the byte to be rewritten is raised to a high level in a manner to be described below First, when the clock signal $\phi$ rises to 5V, the node N4 is charged up through capacitance coupling by means of the capacitance $C_3$ At this time, a potential of the node N3 becomes a potential which is lowered by the threshold voltage $V_{TH}$ of the transistor 21 from a potential of the node N4, and then the node N4 is charged through the transistor 20. Then, the clock signal $\phi_2$ falls to 0V and the nodes N3 and N4 are stabilized at a given potential. Thereafter, when the clock signal $\phi_2$ rises again to 5V, the node N4 is further charged up through capacitance coupling by means of the capacitance $C_3$ in the same manner as described above and a potential of the node N3 is raised. This operation is repeated hereinafter, whereby the potentials of the nodes N3 and N4 are increased and the potential of the node N3, that is, the control gate line 11 is finally raised up to Vpp + $V_{TH}$. The reason for raising the potential of the control gate line 11 to the high level by analyzing a high voltage Vpp repeatedly through switching operation of the high voltage switch 22 is that the high voltage Vpp is generated on the chip using a charge pump and the like, causing the current supplying ability to be limited.

Meanwhile, a potential of only one word line 4 corresponding to a page to be rewritten is at the high voltage during the erasing cycle and the subsequent programming cycle by means of the addressed X decoder 5, with select gate transistors 1 and 13 on that word line 4 being on. As a result, as described above, when the potential of the control gate line 11 rises to the high voltage, a high voltage is applied to the control gate of the memory transistors 2 through the select gate transistor 13 which is on and all the memory cells of a byte to be rewritten are erased together.

When the erasing cycle is completed, the reset signal RST2 rises to the "H" level and the transistor 23 is turned on. As a result, electric charge stored in the capacitance $C_4$ is discharged and the latch of the control gate line 11 is reset, and then the control gate line 11 is kept at "L" level during the subsequent programming cycle.

During the programming cycle, the high voltage Vpp is raised up to 20V as in the erasing cycle and also the charge-up clock signal $\phi_1$ starts to oscillate. Since the potential "H" of the bit line 3 corresponding to a bit where "0" is to be written is latched by the capacitance $C_2$, the corresponding transistor 19 is on and, therefore, the clock signal $\phi_1$ is applied only to the capacitance $C_1$ of the high voltage switch 16 corresponding to a bit where "0" is written through the on-state transistor 19. As a result, the high voltage switch 16 operates in the same manner as described above and a voltage of the bit line 3 rises to the high voltage. Thus, programming operation is performed by application of the high voltage to the drain of the memory transistor 2 of a memory cell 3 in which "0" is to be written.

When the programming is completed, the reset signal RST1 becomes "H" and the transistor 17 is turned on. Then electric charge stored in the capacitance $C_2$ is discharged, with the result that the latch of the bit line 3 is reset.

Since the conventional semiconductor memory device is structured as described above and a column latch portion is of a dynamic type formed by capacitance, it suffers from a disadvantage that data which has been latched is erased when a junction leak of a PN junction occurs frequently.

In order to overcome this disadvantage, it is proposed that latch portions of the capacitance $C_2$ and $C_4$ are structured by CMOS inverters used often in memory cells of a static RAM, as shown in FIG. 3. FIG. 3 shows a case in which a column latch 18 of the bit line 3 comprises two CMOS inverters 26 and 27 having inputs and outputs connected in loop. More specifically, the bit line 3 is connected to the input of the CMOS inverter 27, the output of which is connected to the input of the CMOS inverter 26, and the output of the CMOS inverter 26 is connected to the bit line 3. Reference character $V_{DD}$ indicates a power supply. A column latch 24 (not shown) of the control gate line 11 is also structured in the same manner. In FIG. 3, for example, if the output of the CMOS inverter 27 becomes "L" to cause the output of the CMOS inverter 26 to be "H", the potential "H" of the bit line 3 is latched by the column latch 18.

Meanwhile, although leakage and the like do not occur and a permissible range of operation becomes large in the above described CMOS structure, it is necessary to form an n well region on a p type substrate and also to keep a given distance between this n well region and an active region of an n channel MOS transistor for preventing a latch-up. As a result, an area required for column latch becomes larger (approximately 2700 $\mu m^2$) as compared with a case in which, for example only n channel MOS transistors are used, causing a chip size as a semiconductor memory device to increase.

A column latch circuit as mentioned above comprising inverters of an n channel depletion MOS transistor and an n channel enhancement MOS transistor is described in IEEE International Solid-State Circuits Conference in 1985, pp. 170–171. Since the column latch circuit described in the prior art is structured by MOS transistors of the same polarity, the chip size can be reduced as compared with the column latch circuit shown in FIG. 3. However, since n channel depletion MOS transistors are employed, a current always needs to flow into the above mentioned inverters, causing another disadvantage that current consumption is increased. Since as many as several hundred of the column latch circuits such as described in this specification are provided in most cases, even if current consumption of each column latch circuit is small, current consumption as a whole becomes significantly large, which is a very serious problem.

The present invention is made to overcome the above-mentioned disadvantages and it is an object of the present invention to provide a semiconductor memory device in which a chip size and current consumption is prevented from increasing and a large permissible range of operation is assured.

Briefly stated, a latch circuit for latching a signal level of a predetermined signal line at the time of writing information comprises first and second MOS transistors each having its gate connected to the drain of the other in a crossed manner and their sources connected to the ground and one of the drains connected to a predetermined signal line, and third and fourth MOS transistors of the same polarity as that of the first and second MOS transistors, provided between the drains of the first and second MOS transistors and power supply terminals, respectively. Thus, the latch circuit of the present invention comprises MOS transistors of the same polarity and it statically latches the signal level of a predetermined signal line at the time of writing information.

According to the present invention, since the above-mentioned latch circuit comprises MOS transistors of the same polarity, an area required for column latch, which was approximately 2700 $\mu m^2$ in the conventional column latch of a CMOS, structure is reduced to approximately 1350 $\mu m^2$ and, as a result, chip size can be reduced. In addition, since data is statically latched, current consumption is small, latched data is not erased and a permissible range of operation can be increased.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
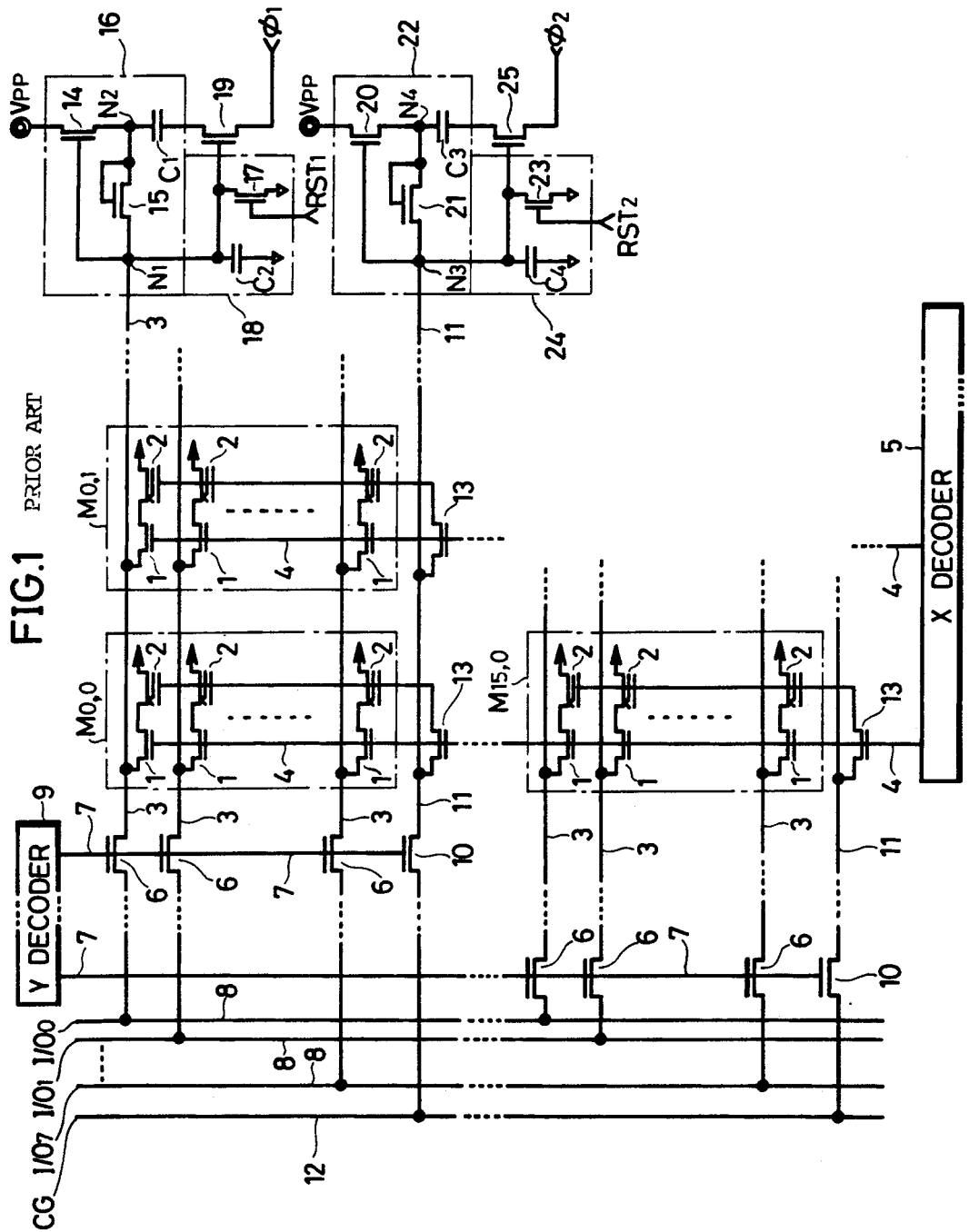
FIG. 1 is a circuit diagram showing a conventional EEPROM.
Figure 2:
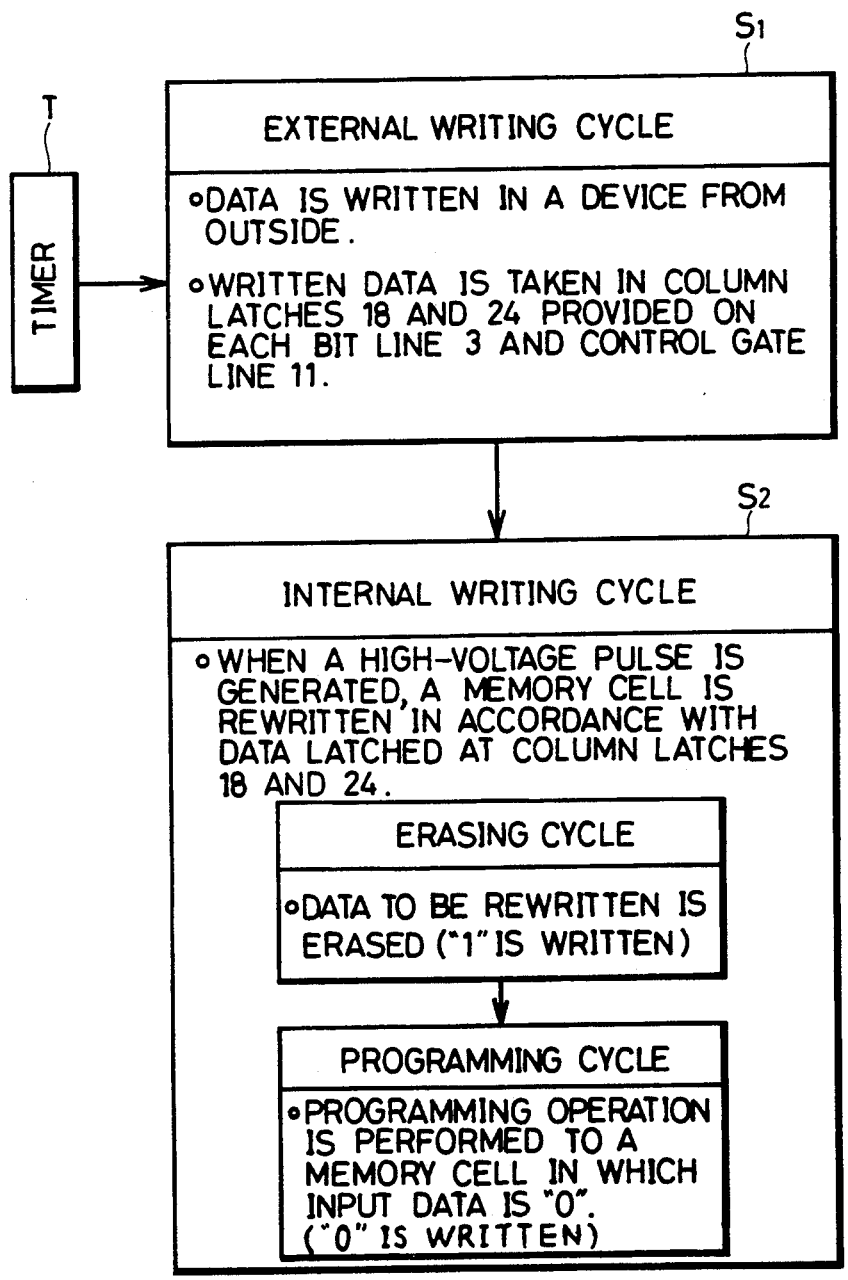
FIG. 2 is a flow chart showing a page mode writing cycle.
Figure 3:
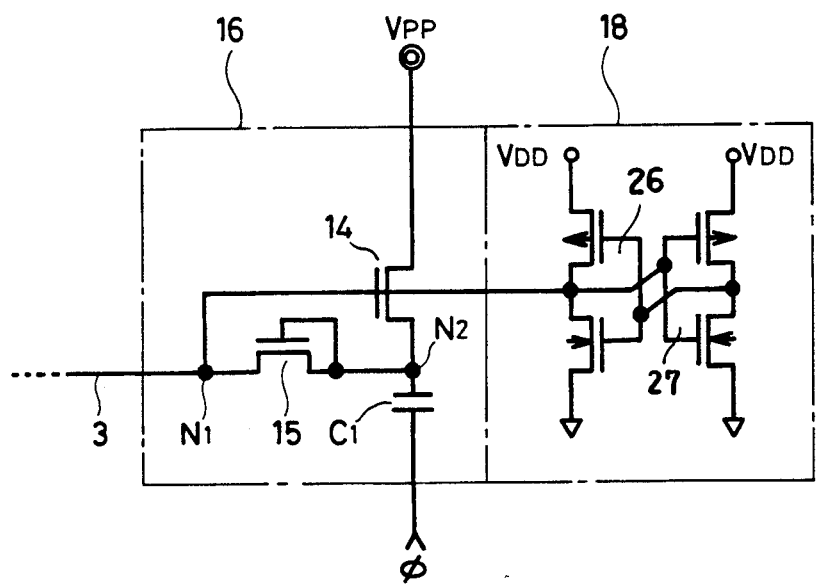
FIG. 3 is a circuit diagram showing a conventional column latch.
Figure 4:
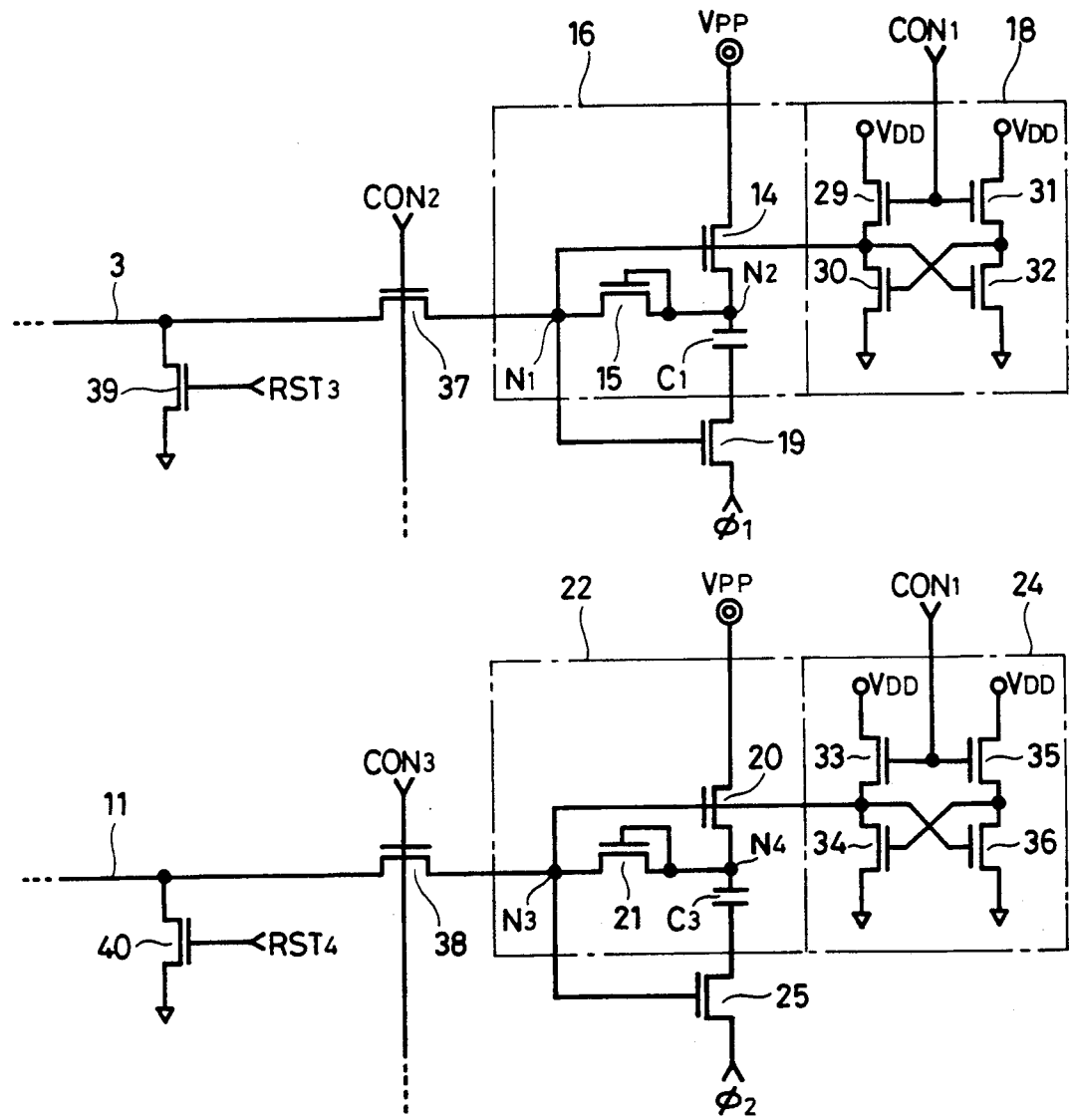
FIG. 4 is a circuit diagram showing one embodiment of the present invention.

FIG. 4 is a partial circuit diagram showing a semiconductor memory device of one embodiment in accordance with the present invention and, more particularly, showing column latch circuits and their adjacent circuit portion. Referring to the figure, there are provided high voltage switches 16 and 22 of a bit line 3 and a control gate line 11, respectively, and transistors 19 and 25 controlling the passage and cutoff of charge-up clock signals $\phi 1$ and $\phi 2$, respectively, which all have the same structure as the conventional circuit of FIG. 1. A column latch 18 of the bit line 3 comprises transistors 29 to 32 and column latch 24 of the control gate line 11 comprises transistors 33 to 36. The transistors 29 to 36 are all n channel enhancement MOS transistors.

Gates and drains of the transistors 30 and 32 are connected in a crossed manner with each other and the sources of the transistors are grounded. The transistors 29 and 31 are provided between the drains of the transistors 30 and 32 and power supplies $V_{DD}$, respectively, and a control signal CON1 is applied to their gates. Similarly, the transistors 34 and 36 have their gates and drains connected in a crossed manner with each other and their sources grounded. The transistors 33 and 35 are provided between the drains of the transistors 34 and 36 and the power supplies $V_{DD}$, respectively, and the control signal CON1 which is the same as those of the transistors 29 and 31 is applied to their gates. A transistor 37 in the bit line 3 serves to shape a waveform of a high voltage transferred from the high voltage switch 16 to the bit line 3 in response to a control signal CON2 applied to its gate, while a transistor 38 in the control gate line 11 serves to shape a waveform of a high voltage transferred from the high voltage switch 22 to the control gate line 11 in response to a control signal CON3 applied to its gate. A transistor 39, connected between the bit line 3 and the ground, and a transistor 40 connected between the control gate line 11 and the ground are turned on in response to the reset signals RST3 and RST 4 applied to their gates, thereby to withdraw the high voltages of the bit line 3 and the control gate line 11 which have been raised by means of the high voltage switches 16 and 22.

Figure 5:
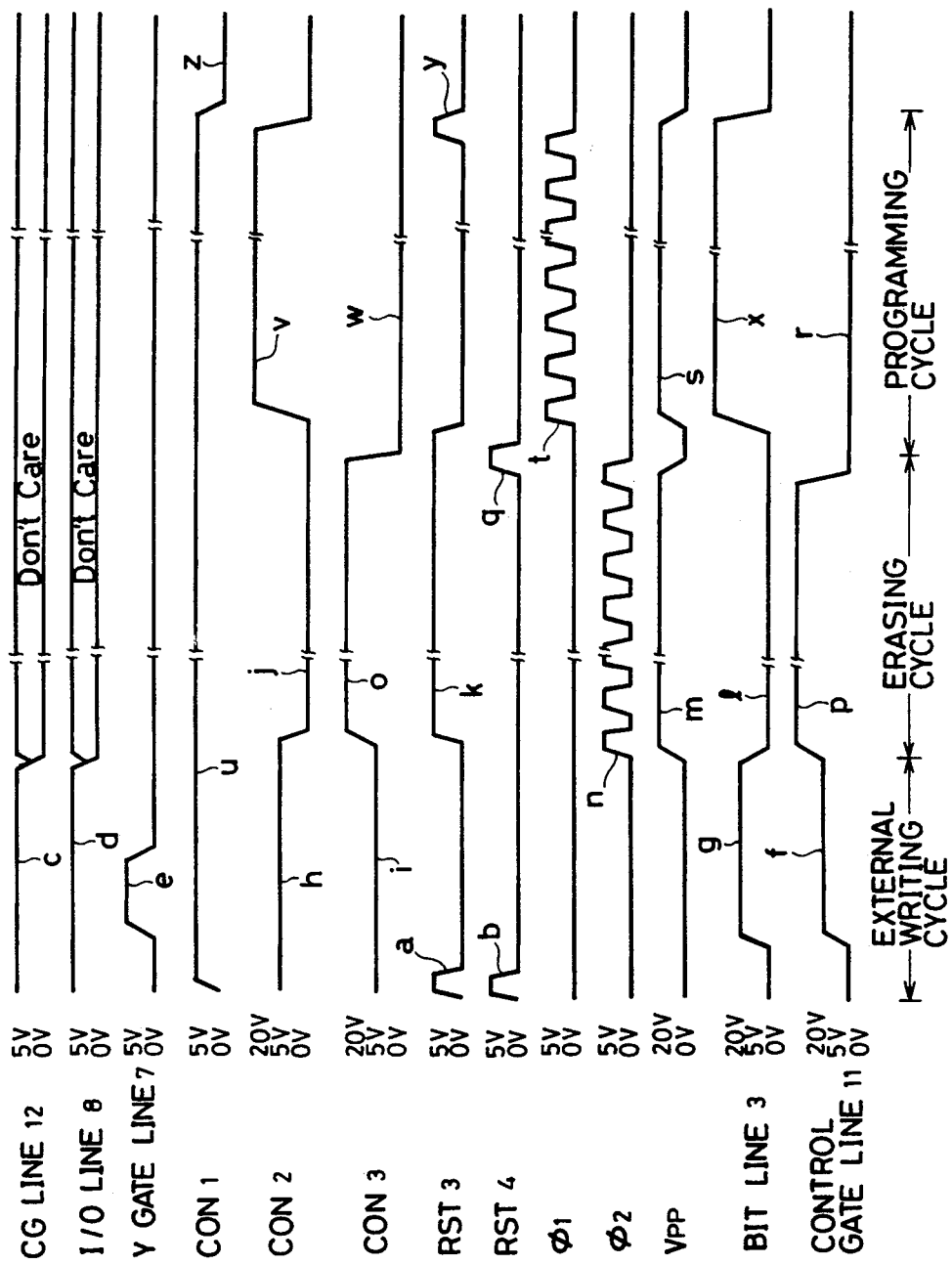
FIG. 5 is a timing chart for explaining operation of the embodiment shown in FIG. 4.

FIG. 5 is a timing chart showing operation of the circuit of FIG. 4. Referring to the conventional circuit of FIG. 1 as well as the timing chart of FIG. 5, a description is made of operation of the circuit of FIG. 4.

When a power supply is turned on and a writing cycle is started, the reset signal RST3 becomes "H" level as shown by a in FIG. 5 and it is applied to the gate of the transistor 39. At the same time, the reset signal RST4 becomes "H" level as shown at b in FIG. 5 and it is applied to the gate of the transistor 40. Accordingly, the transistors 39 and 40 are turned on and the bit line 3 and the control gate line 11 are reset together to "L" level. As shown at u in FIG. 5, the control signal CON1 is at "H" level only during an external writing cycle, an erasing cycle and a programming cycle and, accordingly, the transistors 29, 31, 33 and 35 are turned on to activate the column latches 18 and 24. The control signal CON1 is at "L" level during other period whereby the column latches 18 and 24 are inactivated and current consumption is controlled.

When an external writing cycle is started, a CG line 12 is kept at "H" level as shown at c in FIG. 5 and a potential of an I/O line 8 changes to "L" or "H", in response to "1" or "0" of input data, respectively. In FIG. 5, "0" is inputted as input data, so that the I/O line 8 is in the "H" state as shown at d. Only one Y gate line 7 becomes "H" as shown at e in FIG. 5 by means of a Y decoder 9 for a combination of Y addresses and Y gate transistors 6 and 10 on that Y gate line 7 are turned on. As a result, the I/O line 8 is connected to the bit line 3 of a byte selected by that combination of the Y addresses and that bit line 3 becomes "H" as shown at g in FIG. 5 corresponding to the input data "0" and becomes "L" (not shown) corresponding to the input data "1". The CG line 12 is connected to the control gate line 11 of a selected byte and the control gate line 11 becomes "H" as shown at f in FIG. 5.

During the external writing cycle, the control signals CON2 and CON3 are kept at "H" level as shown at h and i in FIG. 5 and, as a result, the transistors 37 and 38 are turned on. Consequently, potentials of the bit line 3 and the control gate line 11 of the selected byte are latched by the column latches 18 and 24, respectively. More specifically, when "H" level is applied, the transistors 32 and 36 are turned on and the transistors 30 and 34 are turned off and, as a result, nodes N1 and N3 of the latch are statically latched at "H" level, while when "L" level is applied, the transistors 30 and 34 are turned on and the transistors 29 and 33 are turned off and, as a result, the nodes N1 and N3 of the latch is statically latched at "L" level. These processes are applied to all the bytes to be rewritten of the same word line 4, that is, of the same page.

When the external writing cycle is completed, an erasing cycle is started. During the erasing cycle, the control signal CON2 is kept at "L" level as shown at j in FIG. 5 and, the reset signal RST3 is kept at "H" level as shown at k in FIG. 5. As a result, that transistor 37 is turned off and the transistor 39 is turned on, so that the bit line 3 is cut from the column latch 16 to be grounded and kept "L" level as shown at 1 in FIG. 5. On the other hand, the bit line 3 may be maintained at the floating state without causing,. the reset signal RST3 to be at "H" level as shown at k in FIG. 5 and without causing the transistor 39 to be conductive.

Also during the erasing cycle, the high voltage Vpp is raised up to 20V as shown at m in FIG. 5 and a charge-up clock signal $\phi 2$ starts to oscillate as shown at n in FIG. 5. The control signal CON3 is also raised up to 20V as shown at o in FIG. 5. Since the node N3 of the latch of the control gate line 11 of a byte to be rewritten is latched at "H" level, the transistor 25 is on and the clock signal $\phi 2$ is applied to the capacitance $C_3$ to that conducting transistor 25. As a result, the high voltage switch 22 starts to operate and a voltage of the control gate line 11 of a byte to be rewritten is raised to high voltage as shown at p in FIG. 5. Although it is not shown in the timing diagram of FIG. 5, a voltage of only one word line 4 corresponding to a page to be rewritten is at the high voltage by means of an X decoder 5 in accordance with a combination of X addresses and select gate transistors 1 and 13 on that word line 4 are on. As a result, a high voltage pulse is applied to the control gates of all the memory transistors 2 of a byte to be rewritten so that erasing operation is performed.

At this time, the high voltage transferred from the high voltage switch 22 to the control gate line 11 is controlled by the control signal CON3 and, therefore, a high voltage of uniform value and waveform can be transferred to all the control gate lines 11 regardless of a difference in time constants due to a distance of the Vpp signal line between a high voltage source such as a charge pump and each voltage switch 22. More specifically, if the control signal CON3 applied to the gate of the transistor 38 is prevented from rising earlier than the high voltage waveform of a portion in which the Vpp signal line is the longest (that is, the time constant is the largest and the high voltage waveform is the least steep), a value and a waveform of a high voltage transferred to the control gate line 11 are controlled by the control signal CON3 to be uniform. As a result, an amount of threshold shift of all the memory transistors 2 can be uniform and it becomes possible to avoid application of an excessive stress to the memory transistors 2.

When the erasing cycle is completed, the reset signal RST4 becomes "H" level as shown at g in FIG. 5q, thereby the transistor 40 is turned on. Then, a high voltage which has been at the high voltage during the erasing cycle falls and the latch of the control gate line 11 is reset, so that the control gate line 11 will be kept at "L" level as shown at r in FIG. 5 during the next programming cycle.

During the programming cycle, the high voltage Vpp is raised up to 20V as shown at s in FIG. 5 and the clock signal $\phi 1$ starts to oscillate as shown at t in FIG. 5. The control signal CON2 is also raised up to 20V as shown at v in FIG. 5. The control signal CON3 becomes "L" level as shown at w in FIG. 5 and, accordingly, the transistor 38 is turned off. Since the node N1 of the latch of the bit line 3 corresponding to a bit where "0" is to be written is latched at "H" level, the transistor 19 is on and the clock signal $\phi 1$ is applied to the capacitance $C_1$ through the conducting transistor 19. As a result, the high voltage switch 16 starts to operate and a voltage of the bit line 3 is raised to the high voltage as shown at x in FIG. 5. As described above, a voltage of only one word line corresponding to a page to be rewritten is at the high voltage and the select gate transistors 1 and 13 of that word line 4 are on. Therefore, a high voltage pulse is applied to the drains of the memory transistors 2 of all the bits where "0" is to be written, so that the programming operation is performed. At this time, a high voltage transferred from the high voltage switch 16 to the bit line 3 is controlled by the control signal CON2 and made uniform in the same manner as in the case of the above described control gate line 11.

When the programming is completed, the reset signal RST3 becomes "H" level as shown by y in FIG. 5 and the transistor 39 is turned on, with the result that the high voltage which has been applied during the programming cycle falls and the latch of the bit line 3 is reset. Thus, a series of writing cycles are completed and the control signal CON1 falls to "L" level as shown at z in FIG. 5. As a result, the transistors 29, 31, 33 and 35 are turned off and the column latches 18 and 24 are inactivated.

In the above described embodiment, since data can be controlled for rewriting on a per byte basis data of the byte not necessary to be rewritten is not rewritten even if rewriting of data is performed in a page mode, and the number of rewriting times of memory cells in each byte can be minimized. As a result, the lifetime, of a non-volatile semiconductor memory device can be prolonged. However, if this advantage is not desired, data may be rewritten in common in all the memory cells connected to the same word line when rewriting of data is performed in the page mode. In this case, it is not necessary to provide a control gate line 11 for each byte, and accordingly, the column latch 24 for the control gate line is not required.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having latch circuits for latching a signal level of a predetermined signal line to write information, comprising:
   first and second enhancement mode MOS transistors of a single conductivity type having gates and drains connected with each other in a crossed manner and sources grounded, one of said drains being connected to the predetermined signal line; and
   third and fourth enhancement mode MOS transistors of the same conductivity type as that of said first and second MOS transistors, provided between said drains of said first and second MOS transistors and power supply terminals, respectively, and wherein a control signal is applied to gates of said third and fourth MOS transistors to turn on said third and fourth transistors only at the time of writing information.

2. A semiconductor memory device in accordance with claim 1, wherein said first to fourth MOS transistors comprise n channel enhancement MOS transistors.

3. A semiconductor memory device in accordance with claim 2, wherein said latch circuit comprises a column latch circuit used in an electrically erasable programmable non-volatile semiconductor memory device.

4. A semiconductor memory device in accordance with claim 3, wherein said non-volatile semiconductor memory device comprises:
   plurality of word lines;
   a plurality of bit lines arranged in a crossed manner with said plurality word lines; and
   a plurality of memory cells arranged at connection points of said word lines and bit lines,
   said column latch circuit being provided on each of said plurality of bit lines.

5. A semiconductor memory device in accordance with claim 4, wherein said non-volatile semiconductor memory device comprises:
   information input means for inputting information from outside; and
   information supply means for selectively supplying information inputted from said information input means to said bit lines,
   each said column latch circuit latching a potential of information selectively supplied to said each bit line before information is written in any of said memory cell.

6. A semiconductor memory device in accordance with claim 5, wherein said non-volatile semiconductor memory device further comprises word line selecting means for selecting any of said word line, each said memory cell comprising:
   a memory device for storing information, and
   a transfer gate connecting said memory device to a corresponding one of said bit lines in accordance with selection of said word line,
   said potential of information latched by each said column latch circuit being written together in each corresponding memory device through a transfer gate of the selected word line.

7. A semiconductor memory device in accordance with claim 6, wherein each said memory device comprises a floating gate type MOS transistor.

8. A semiconductor memory device in accordance with claim 7, wherein said floating gate type MOS transistor comprises a control gate, and information can be rewritten by a high voltage applied to said control gate.

9. A semiconductor memory device in accordance with claim 8, wherein said memory cells are grouped per byte into a predetermined number of memory cells belonging to the same one of said word lines,
   said non-volatile semiconductor memory device comprising:
   a plurality of control gate lines arranged for each of a plurality of bytes belonging to the same one of said bit lines and connected in common to the control gates of said floating gate type MOS transistors comprised in the corresponding bytes;
   control gate voltage inputting means for inputting said high voltage to rewrite information in said floating gate type MOS transistors; and
   control gate voltage supply means for selectively supplying said inputted high voltage to said control gate lines.

10. A semiconductor memory device in accordance with claim 9, wherein said column latch circuit is provided on each of said plurality of control gate lines.

11. A semiconductor memory device in accordance with claim 10, wherein said column latch circuit provided on each of control gate lines latches said high voltage selectively supplied to each said control gate line before information is written to said memory cell.

12. A semiconductor memory device in accordance with claim 11, wherein each said column latch circuit provided on each bit line and each said column latch circuit provided on each control gate line comprise a high voltage switch for increasing a corresponding latch output.

13. A digital semiconductor memory device suitable for integration with other digital circuits on a single chip, comprising:

first and second enhancement mode MOS transistors of a single conductivity type having gates and drains connected with each other in a crossed manner and sources grounded, one of said drains being connected to a predetermined input signal line; and third and fourth enhancement mode MOS transistors of the same conductivity type as that of the first and second MOS transistors, provided between said drains of said first and second MOS transistors and power supply terminals, respectively, and wherein a control signal is applied to gates of said third and fourth MOS transistors to turn on said third and fourth MOS transistors only at the time of writing information.

14. In an electrically erasable, programmable, non-volatile read-only memory device comprising a plurality of word lines, a plurality of bit liens arranged in a crossed manner with said plurality of word lines, and a plurality of memory cells arranged at connection points of said word lines and said bit lines and including a column latch circuit on each of said plurality of bit liens, the improvement comprising:

a memory circuit in said column latch circuit including first and second enhancement mode MOS transistors of a single conductivity type having gates and drains connected with each other in a crossed manner and sources grounded, one of said drains being connected to a predetermined bit line; and third and fourth enhancement mode MOS transistors of the same conductivity type as that of the first and second MOS transistors, provided between said drains of said first and second MOS transistors and power supply terminals, respectively, the gates of said third and fourth MOS transistors being coupled to a control signal to turn on said third and fourth MOS transistors only at the time of writing information into said electrically erasable programmable read-only memory.

15. A method of reducing power consumption in an electrically erasable programmable read-only memory operating in a page mode and including column latch circuits, each said column latch circuit including two cross-coupled inverters and each said inverter including two series connected transistors of a single enhancement made conductivity type, comprising the steps of:

generating a control signal which has a predetermined logical level only at the time of writing information and applying said control signal to the gate of a first transistor of each of said inverters to turn on said first transistors of said inverters, whereby, current through said inverters is reduced during periods when information is not being written.

* * * * *